United States Patent [19]

Yamazaki et al.

[11] Patent Number: 5,391,946
[45] Date of Patent: Feb. 21, 1995

[54] FREQUENCY CONVERTING CIRCUIT APPARATUS

[75] Inventors: Daisuke Yamazaki; Yukihiro Furuya, both of Kanagawa, Japan

[73] Assignee: Sony Corporation, Tokyo, Japan

[21] Appl. No.: 54,241

[22] Filed: Apr. 30, 1993

[30] Foreign Application Priority Data

Apr. 30, 1992 [JP] Japan .................. 4-138072

[51] Int. Cl.⁶ .......................................... H03B 19/00
[52] U.S. Cl. .................... 327/113; 327/258; 327/44
[58] Field of Search ............... 307/529, 511, 522, 523, 307/513, 262, 271, 269, 261; 328/104, 133, 134, 139, 158

[56] References Cited

U.S. PATENT DOCUMENTS 4,558,282  12/1985  Lowenschuss .................. 307/522
4,607,236   8/1986  Le Queáu ........................ 328/133

FOREIGN PATENT DOCUMENTS 0035007  2/1986  Japan .......................... 307/262

*Primary Examiner*—William L. Sikes
*Assistant Examiner*—James A. Dudek
*Attorney, Agent, or Firm*—Hill, Steadman & Simpson

[57] ABSTRACT

In the frequency conversion apparatus, the frequency of an analog signal is converted into optional frequency with a simple construction without requiring digital signal processing. The phase component of the input signal is phase shifted to the first and second phase-shifting signal having orthogonal phases, then the phase-shifted signals are multiplied by the first and second oscillating outputs having orthogonal phases and are modulated. Continuously, by multiplying the third oscillating output by a side-band signal extracted by adding the first and second multiplied outputs to each other. A third multiplied output can be obtained comprising the demodulated signal of the input signal. Thereby, the frequency of the input signal can be converted into any frequency by analog processing without performing digital signal processing.

4 Claims, 2 Drawing Sheets

FREQUENCY CONVERTING CIRCUIT APPARATUS

FIELD OF THE INVENTION

This invention relates to a frequency converting circuit apparatus, and is suitable, for example, in changing the tone of voice by converting the frequency of voice signal into optional frequency in audio frequency band.

BACKGROUND OF THE INVENTION

As shown in FIG. 1, in such as voice conversion technic (so-called voice changer) in which the tone of voice and tone color are changed by changing the frequency of a voice signal or a musical tone signal, digital signal processing technic is used in generally.

That is, the voice signal inputted from an input terminal 1 is converted into digital data by an analog/digital conversion circuit 2, and the digital voice signal temporarily stored in memory 3 is read out in a different sampling frequency, or is interpolated to read out, to a digital/analog conversion circuit 4, in which the data is converted again into an analog voice signal, under the control of a control unit 5 composed of microcomputer. Thereby, the voice signal different in frequency and amplitude from that of the input voice signal is outputted.

However, in this system, there is needed a digital signal processing circuit required such a higher technique that the analog/digital conversion circuit 2, the digital/analog conversion circuit 4 and memory 3 and the like are controlled by control unit composed of microcomputer 5, in order to achieve such only an effect that a tone and tone color can change. Therefore the system becomes more complex to obtain similar to the above effect.

Also, the conventional analog/digital and digital/analog conversion circuits 2 and 4 generate quantization noise in voice frequency band, so that the signal to noise ratio (S/N ratio) becomes greatly reduced. Therefore, when there is no signal, it is necessary to perform muting together with masking for the improvement of the S/N ratio for practical use.

Also, the peripheral devices may be subjected to electromagnetic disturbance, by the high frequency sampling clock signal.

SUMMARY OF THE INVENTION

In view of the foregoing, an object of this invention is to provide a frequency converting circuit in which it can be converted a frequency of an audio signal into optional frequency without digital signal processing and with executing simpler analog signal processing circuit compared with conventional circuit.

To solve the above problems, this invention is to comprise: a phase-shifting means 2 for phase-shifting the phase component of input signal S1 and outputting the first and second phase-shifted signals S2 and S3 the phases of which are orthogonal each other; multiplication means 13 and 14 for multiplying the first and second phase-shifted signals S2 and S3 by the first and second oscillating outputs S4 and S5 having orthogonal phases modulating to output first and second phase-shifting signal S2 and S3; side-band signal extraction means 17 for adding the first and second multiplied outputs S6 and S7 outputted from the multiplying means 13 and 14, and extracting the side-band signal S8; demodulating means 18 for multiplying the side-band signal S8 by the third oscillating output S9 and outputting the third multiplied signal S10 including the demodulated signal of the input signal S1.

After phase-shifting the phase component of the input signal S1 into the first and second phase-shifting signals S2 and S3 the phases of which are orthogonal each other, the first and second phase-shifting signals S2 and S3 are multiplied by the first and second oscillating outputs S4 and S5 the phases of which are orthogonal each other. The first and second multiplied outputs S6 and S7 are added to each other to extract side-band signal S8. The side-band signal S8 is multiplied by the third oscillating output S9 to the third multiplied signal S10 including demodulating signal of the input signal S1 is outputted. Thereby, the input signal S1 can be converted into optional frequency, without performing digital signal processing as conventional processing.

The nature, principle and utility of the invention will become more apparent from the following detailed description when read in conjunction with the accompanying drawings in which like parts are designated by like reference numerals or characters.

DETAILED DESCRIPTION OF THE INVENTION

Figure 1:
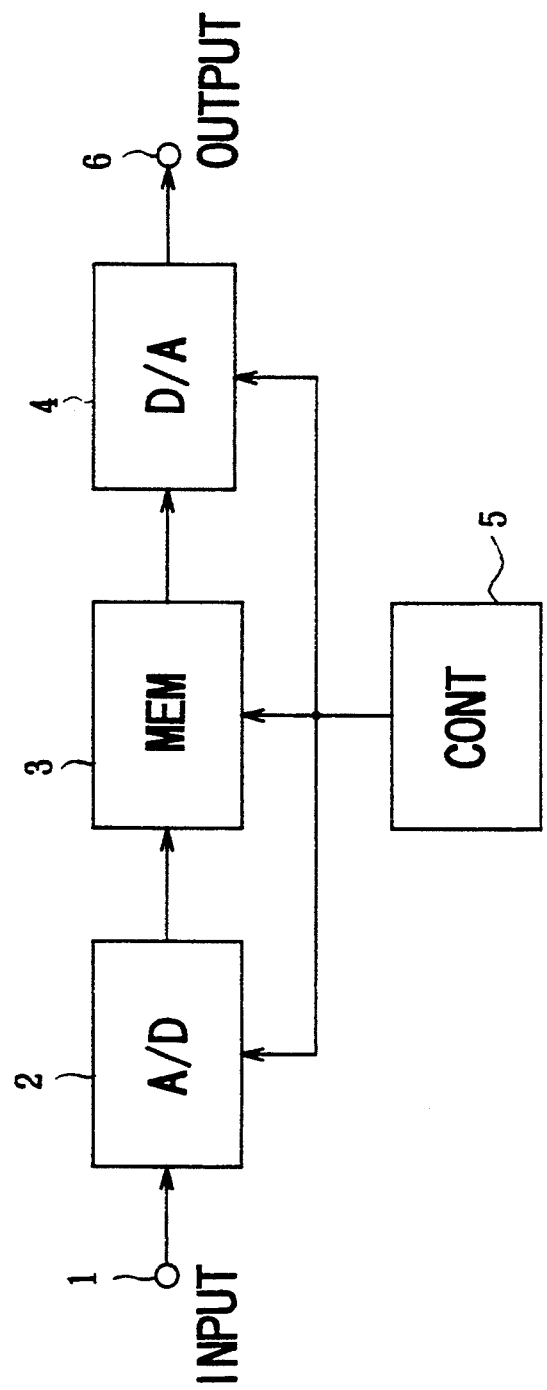
FIG. 1 is a block diagram showing a conventional voice convertor.
Figure 2:
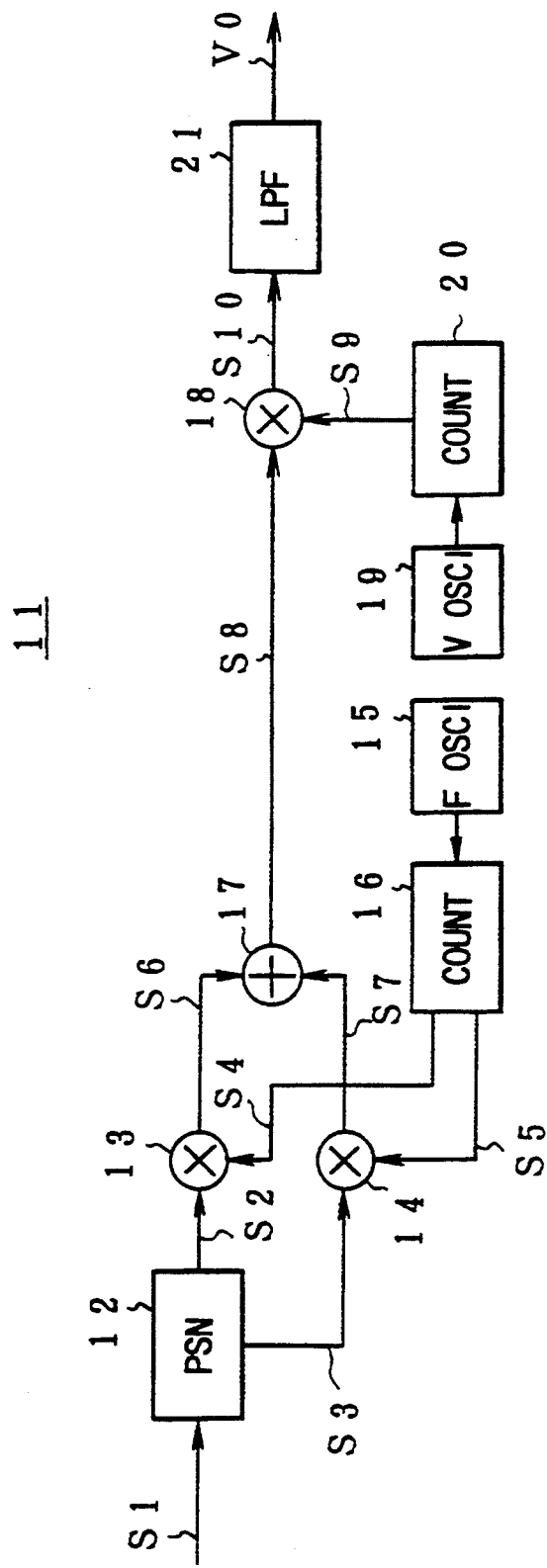
FIG. 2 is a block diagram showing an embodiment of the frequency converting circuit apparatus according to this invention.

Preferred embodiments of this invention will be described with reference to the accompanying drawings:

In FIG. 2, 11 designates the voice frequency converting circuit apparatus, when the voice signal S1 is inputted to the phase-shift circuits 12 consisting of a Phase-Shift Network PSN, the circuit 12 converts the signal S1 into two phase-shifted voice signals S2 and S3 having identical signal levels and a phase difference of 90 degrees to each other in the signal frequency band.

That is, denoting the angular frequency by p and the amplitude by K, the phase-shifting circuit 12 converts the voice signal S1 represented by Kcos (pt) into two phase-shifted voice signals S2 and S3 represented by Kcos (pt) and Ksin (pt), and outputs each of these to the frequency mixers 13 and 14.

Here, the frequency mixers 13 and 14 multiply the phase-shifted voice signals S2 and S3 by signals sin ($\omega$1·t) and cos ($\omega$1·t) which are the two outputs of counter 16. In the counter 16, the output frequency of fixed oscillator 15 which oscillates at constant frequency (100 [KHz]) is divided into ½ angular frequency $\omega$1 (50 [KHz]), and two clock signals S4 and S5 having a phase difference of 90 degrees to each other are outputted from the counter 16. The multiplied results (Kcos (pt)·sin ($\omega$1·t) and Ksin (pt)·cos ($\omega$1·t)) is outputted to the synthesizing circuit 17 consisting of circuits adding the multiplied outputs S6 and S7.

From the addition theorem, as shown in the following, the multiplied outputs S6 and S7 have an upper side-band component and a lower side-band component respectively.

$$K\cos(pt) \cdot \sin(\omega 1 \cdot t) = \frac{K}{2} \cdot (\sin(p + \omega 1)t + \sin(p - \omega 1)t) \quad (1)$$

-continued $$K\sin(pt) \cdot \cos(\omega 1 \cdot t) = \frac{K}{2} \cdot (\sin(p + \omega 1)t - \sin(p - \omega 1)t) \quad (2)$$

The addition circuit 17, by adding and compositing the multiplied outputs S6 and S7, extracts the upper side-band component from the mixed outputs S6 and S7. The said upper side-band component is provided to the frequency mixer 18 as the composite output S8.

The frequency mixer 18 inputs variable clock signal S9, which is the output of the counter 20 which frequency-divides the output of the variable oscillator 19 into $\frac{1}{2}$ angular frequency ($\omega 1 + q$).

The oscillating frequency of the variable oscillator 19 can be varied into optional value, and the clock frequency of the variable clock signal S9 can be adjusted with a width of 10 [KHz] centering around the frequency of the clock frequency (50 [KHz]) of the clock signals S4 and S5 multiplied by the voice signal S1 in the frequency mixer 13 and 14.

Thereby, denoting the angular frequency of the variable clock signal S9 by $\omega 1 + q$, the variable multiplied output S10 of the frequency mixer 18 has an upper side-band component of high frequency ($p+q+2\omega 1$) and a lower side-band component of low frequency ($p-q$) as shown in the following equation.

$$K \cdot \sin(p + \omega 1)t \cdot \cos(\omega 1 + q) = \quad (3)$$
$$\frac{K}{2}(\sin(p + q + 2\omega 1)t + \sin(p - q)t)$$

Here, the voice frequency conversion apparatus 11, by passing said variable mixed output S10 through a low-pass filter 21, outputs a voice signal having frequency p, of the voice signal S1, varied according to the difference q between the clock signal S4 (S5) and the clock frequency of the variable clock signal S9 as shown in the following equation.

$$VO = \frac{K}{2} \cdot \sin(p - q)t \quad (4)$$

With the above construction, the voice signal S1 is converted into the phase-shifted voice signals S2 and S3 having a phase difference of 90 degrees to each other, and by adding the multiplied outputs S6 and S7 which are the product of the orthogonal clock signals S4 and S5 and said phase-shifted voice signals S2 and S3, the side-band signal is extracted. Then said side-band signal is multiplied by the third oscillating output. Thereby, the frequency of the voice signal S1 can be converted into optional frequency by analog signal processing without digital signal processing.

Also, by enabling the conversion of frequency by analog signal processing, bad influence of such as clock noise to the outside can be avoided.

Besides, in the embodiment discussed above, the present invention is utilized for a so-called voice changer, however this invention is not limited to this and is widely applicable when shifting the signal frequency of a analog signal to optional value.

Further, in the embodiment discussed above, the oscillating frequency of the fixed oscillator 15 is set to 100 [KHz] and the oscillating frequency of the other variable oscillator 19 is set to vary within a range of 20 [KHz] centering around 100 [KHz], however this invention is not limited to this and the fixed oscillator may be set to oscillate at other frequencies, and the variable range of the variable oscillator can be set to any value.

Further, in the embodiment discussed above, the upper side-band is extracted by adding the mixed outputs S6 and S7 with the composition circuit 17, however this invention is not limited to this and it may be arranged to extract the lower side-band first by taking the difference of mixed outputs S6 and S7 by a subtracter and to multiply this by the variable clock signal S9.

Furthermore, in the embodiment discussed above, the case when converting frequency of voice signals into any frequency has been discussed, however, this invention is not limited to this but is widely applicable when frequency converting the frequency of the other analog signals.

As discussed above, according to this invention, the phase component of input signal is phase-shifted to the first and second phase-shifted signal having orthogonal phases each other, then said first and second phase-shifting signal is multiplied by the first and second oscillating outputs having a orthogonal phase and is modulated, and by adding the first and second multiplied outputs to each other, the side-band signal extracted, and by outputting the third multiplied signal, which is the product of the side-band signal and the third oscillating output, consisting of the demodulated signal of the input signal, the frequency of the input signal can be converted into optional frequency by analog signal processing.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A frequency converting circuit apparatus for converting the frequency of an input signal having a phase component comprising:
    phase-shifting means for phase-shifting the phase component of the input signal, and outputting first and second phase-shifted signals having orthogonal phases;
    multiplication means for multiplying said first and second phase-shifted signal by first and second oscillating signals at a first frequency having orthogonal phases, and outputting modulated signals of said first and second phase-shifted signals;
    side-band signal extraction means for extracting a side-band signal by adding the first and second multiplied outputs from said multiplication means; and
    demodulation means for multiplying said side-band signal by a third oscillating signal at a second frequency to produce a third multiplied signal, outputting the third multiplied signal comprising demodulated signal of the input signal.

2. The frequency converting circuit apparatus of claim 1, wherein the oscillating second frequency of said third oscillating output can be controlled to vary centering around the frequency of said first oscillating output.

3. The frequency converting circuit apparatus of claim 1, further comprising a low-pass filter which inputs said third multiplied signal, and extracts from said third multiplied signal, the demodulated signal being generated by converting the frequency of said input signal.

4. A frequency converting circuit apparatus of claim 1, wherein said side-band signal extraction means subtracts said first and second multiplied outputs, and extracts a side-band signal.

* * * * *